(12) United States Patent
He et al.

(10) Patent No.: US 6,897,110 B1
(45) Date of Patent: May 24, 2005

(54) METHOD OF PROTECTING A MEMORY ARRAY FROM CHARGE DAMAGE DURING FABRICATION

(75) Inventors: Yi He, Sunnyvale, CA (US); Wei Zheng, Santa Clara, CA (US); Zhizheng Liu, Sunnyvale, CA (US); Mark W. Randolph, San Jose, CA (US); Darlene G. Hamilton, San Jose, CA (US); Ken Tanpairoj, Palo Alto, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 167 days.

(21) Appl. No.: 10/305,750

(22) Filed: Nov. 26, 2002

(51) Int. Cl.[7] .................. H01L 21/336; H01L 21/4763
(52) U.S. Cl. .................... 438/257; 438/262; 438/624
(58) Field of Search ................... 438/624, 257, 438/262

(56) References Cited

U.S. PATENT DOCUMENTS

| | | | | |
|---|---|---|---|---|
| 5,439,835 A | * | 8/1995 | Gonzalez | 438/241 |
| 5,854,099 A | * | 12/1998 | Farrenkopf | 438/201 |
| 6,235,583 B1 | * | 5/2001 | Kawata et al. | 438/257 |
| 6,271,125 B1 | * | 8/2001 | Yoo et al. | 438/637 |
| 6,372,554 B1 | * | 4/2002 | Kawakita et al. | 438/132 |
| 6,426,528 B2 | * | 7/2002 | Lowrey et al. | 257/314 |
| 6,509,255 B2 | * | 1/2003 | Minn et al. | 438/601 |
| 6,664,174 B2 | * | 12/2003 | Ema et al. | 438/601 |
| 6,677,198 B2 | * | 1/2004 | Hsu et al. | 438/257 |
| 6,699,757 B1 | * | 3/2004 | Hwang | 438/262 |
| 6,713,336 B2 | * | 3/2004 | Shin et al. | 438/201 |

* cited by examiner

*Primary Examiner*—Matthew Smith
*Assistant Examiner*—Chuong Anh Luu

(57) ABSTRACT

A method of fabricating a memory array, while protecting it from charge damage. Bitlines that may have source/drain regions of memory cells are formed in a substrate. Wordlines are formed above the bitlines and may have gate regions. Next, a first metal region that is coupled to one of the bitlines is formed above the bitlines. A second metal region that is not electrically coupled to the first metal region is formed. Then, the first metal region is electrically coupled to the second metal region. Charge damage is reduced by keeping the antenna ratio between the first metal region and the bitline low. For further protection, a diode or fuse may also be formed between the substrate and the portion of the metal region that is coupled to the bitline. Also, fuse may be formed between a bitline and a wordline to protect the wordline.

19 Claims, 11 Drawing Sheets

METHOD OF PROTECTING A MEMORY ARRAY FROM CHARGE DAMAGE DURING FABRICATION

TECHNICAL FIELD

The present invention generally pertains to the field of memory arrays. More particularly, embodiments of the present invention are related to a method of protecting storage areas of a memory array from charge damage during fabrication.

BACKGROUND ART

For some time it has been possible to fabricate memory devices such as flash memory that are both reprogrammable and keep their charge when power is removed. Such devices are highly desirable and have many applications from storing a computer system's BIOS to functioning as a memory for devices such as digital cameras. Typically, such memory devices may be reprogrammed hundreds of thousands of times and may be programmed or erased in blocks of, for example, hundreds or thousands of bits.

Such devices may operate by storing a charge in a memory cell. For example, a typical flash memory cell may be programmed to hold a charge in a data storage region of a transistor. Clearly, the memory cell will only be accurate to the extent that the data storage region is able to hold its charge. Unfortunately, some memory cells may suffer charge damage during the fabrication process and hence exhibit poor charge retention during actual operation.

The charge damage may arise as a result of different portions of the memory device being at different potentials during the fabrication process. In this event, charge that moves from the higher to the lower potential region may cause damage to an intervening region, such as the region that is designed to store a charge during actual operation.

Thus, a need has arisen for a way to prevent charge damage to storage areas during fabrication of a memory array.

SUMMARY

Embodiments of the present invention prevent charge damage to storage areas during fabrication of a memory array. Embodiments of the present invention protect a memory array having buried bitlines.

A method of fabricating a memory array, while protecting it from charge damage, is disclosed. First, bitlines are formed in a substrate. The bitlines may comprise source/drain regions of memory cells. Then, wordlines are formed above the bitlines. The wordlines may have gate regions of the memory cells. Next, a first metal region that is coupled to one of the bitlines is formed above the bitlines. A second metal region that is not electrically coupled to the first metal region is also formed. Then, the first metal region is electrically coupled to the second metal region. Thus, the second metal region is not electrically coupled to the bitline during a portion of the fabrication process; however, it is electrically coupled when the memory array is completely fabricated. By thusly keeping the antenna ratio between the first metal region and the bitline low, charge damage is reduced.

In another embodiment, a diode is formed between the substrate and the portion of the metal region that is coupled to the bitline.

In still another embodiment, a fuse is formed between the substrate and the portion of the metal region that is coupled to the bitline. The fuse is blown before the memory array is used.

In still another embodiment, a fuse is formed between one of the bitlines and one of the wordlines to protect the wordline during the fabrication process. The fuse is blown before the memory array is used.

These and other advantages of the present invention will no doubt become obvious to those of ordinary skill in the art after having read the following detailed description of the preferred embodiments which are illustrated in the various drawing figures.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications, and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail as not to unnecessarily obscure aspects of the present invention.

Figure 1:
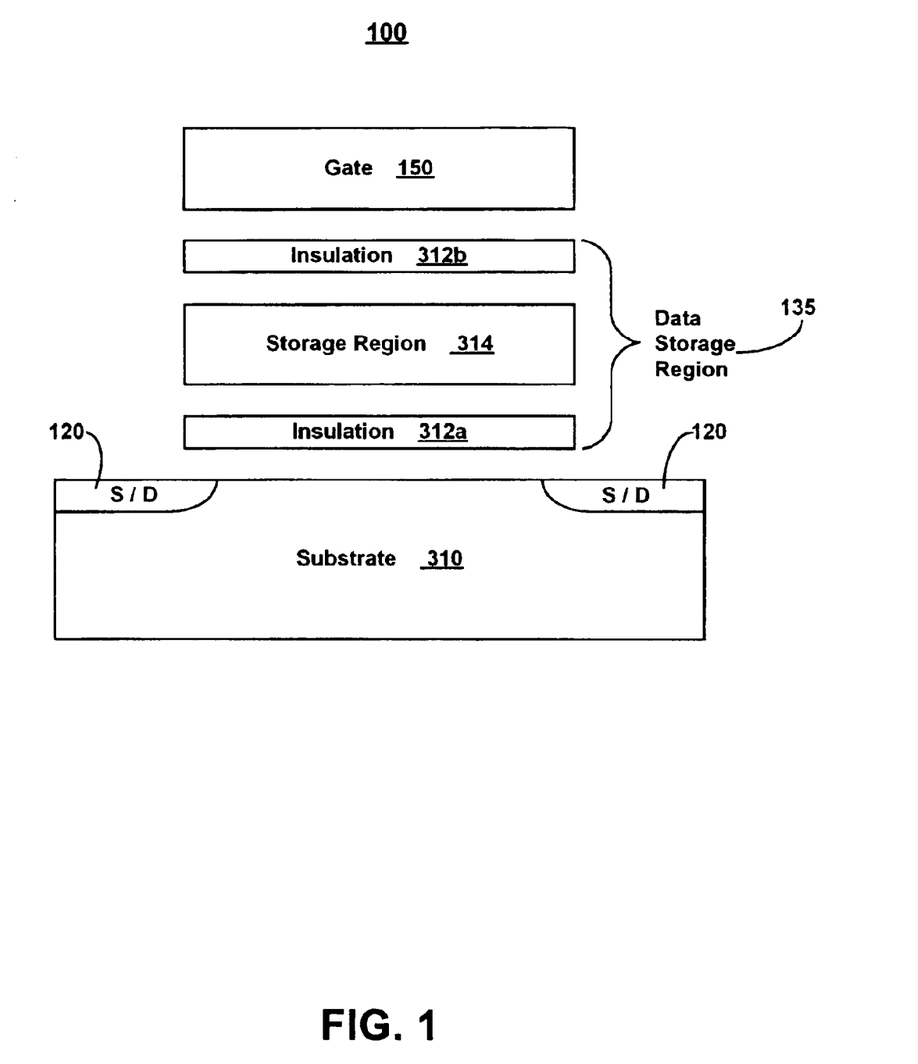
FIG. 1 is a diagram of a memory cell that may be protected by embodiments of the present invention.

FIG. 1 illustrates a single memory cell 100 that may store two bits of information. Embodiments of the present invention protect such a memory cell 100 from charge damage during fabrication, although embodiments of the present invention are not limited to protecting such a device. The memory cell 100 comprises a substrate 310 and a pair of selectable source/drain regions 120. The source/drain regions 120 may be constructed symmetrically and a given source/drain region 120 may operate as either a source or a drain, depending on operating conditions. Above the substrate 310 is a data storage region 135 comprising a charge storage region 314 sandwiched between two insulating layers 312a, 312b. The charge storage region 314 may comprise silicon nitride ($SiN_x$) and the insulating layers may comprise silicon dioxide ($SiO_2$). Above the data storage 135 is a gate 150 that may comprise polysilicon.

Still referring to FIG. 1, the charge storage region 314 may have a low conductivity and high electron/hole trap density. A separate charge may be stored on two distinct locations in the charge storage region. The charges may be on the left and right side of the charge storage region 314.

Figure 2:
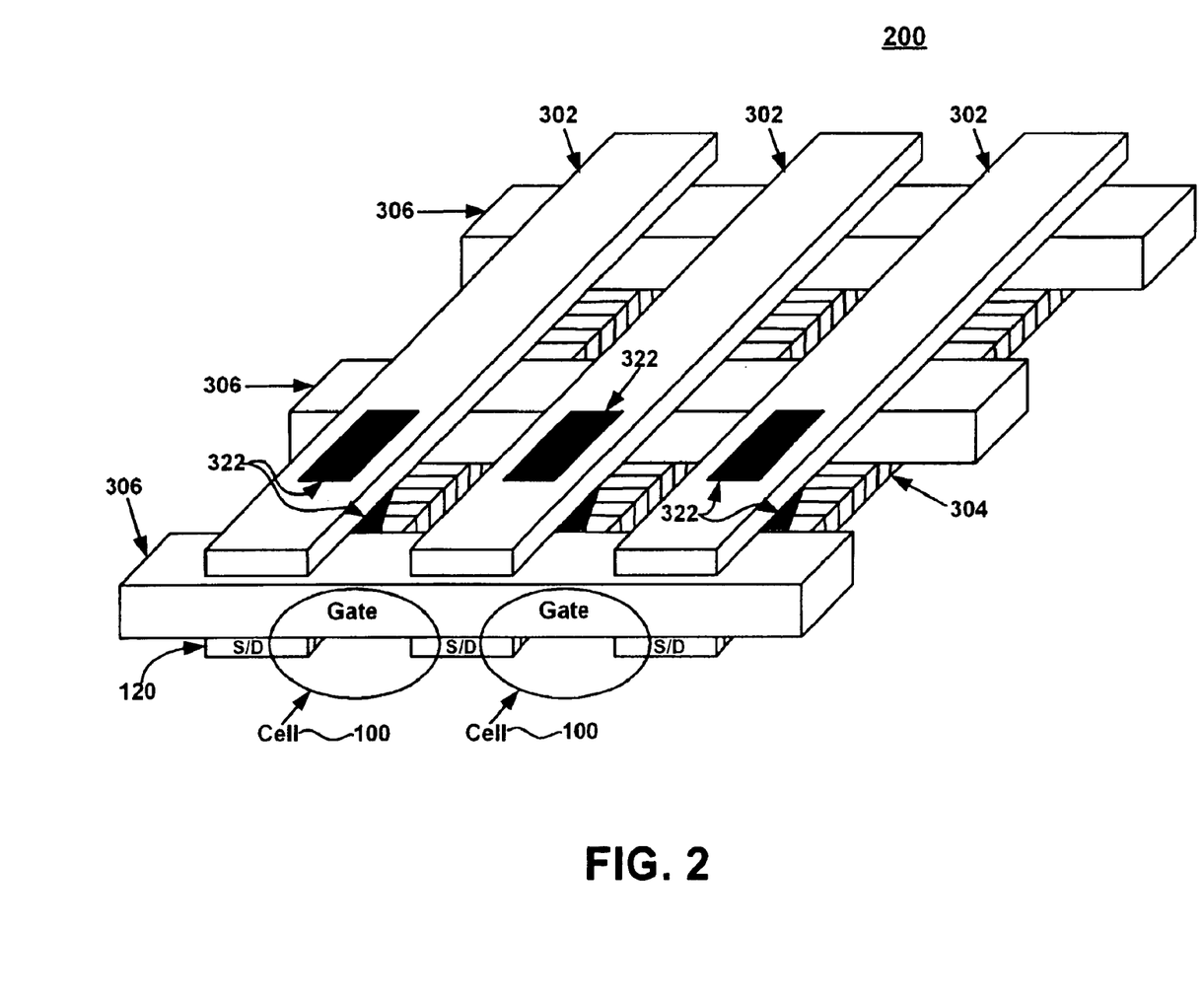
FIG. 2 is a diagram of a memory array that may be protected by embodiments of the present invention.

FIG. 2 illustrates a memory cell array 200 comprising many of the memory cells 100 illustrated in FIG. 1. On the bottom are three bitlines 304, which run from front to back of the array 200. The bitlines 304 may be embedded in a substrate, as seen in FIG. 1, although the substrate is not shown in FIG. 2. Portions of the bitlines 304 form the source/drain regions 120 of memory cells 100, which are encircled on the front of the array 200. Above the bitlines 304 are wordlines 306, which may comprise gate regions 150. Data storage regions 135 are not shown so as to not obscure the illustration. Above the wordlines 306 are metal lines 302, which may deliver voltage to the bitlines 304 though contacts 322. A voltage supplied to a given wordline 306 may control the voltage to the gates 150 on that wordline 306.

When forming such a memory array 200, it is believed that the data storage 135, especially the two insulating layers 312a and 312b, may be damaged by a voltage difference that occurs between a bitline 304 and a wordline 306 or between a wordline 306 and the substrate 310. In particular, the potential differences may arise, at least in part, from the effect of the metal line 302 on the bitline 304 during fabrication. Further, it may be that the charge damage problem is worse for memory cells 100 that are closer to this contact 322.

The damage to the data storage region 135 may hinder the ability of that region to maintain its charge during actual operation or the memory cell 100. Hence, it is desirable to avoid this charge damage during fabrication.

Figure 3A:
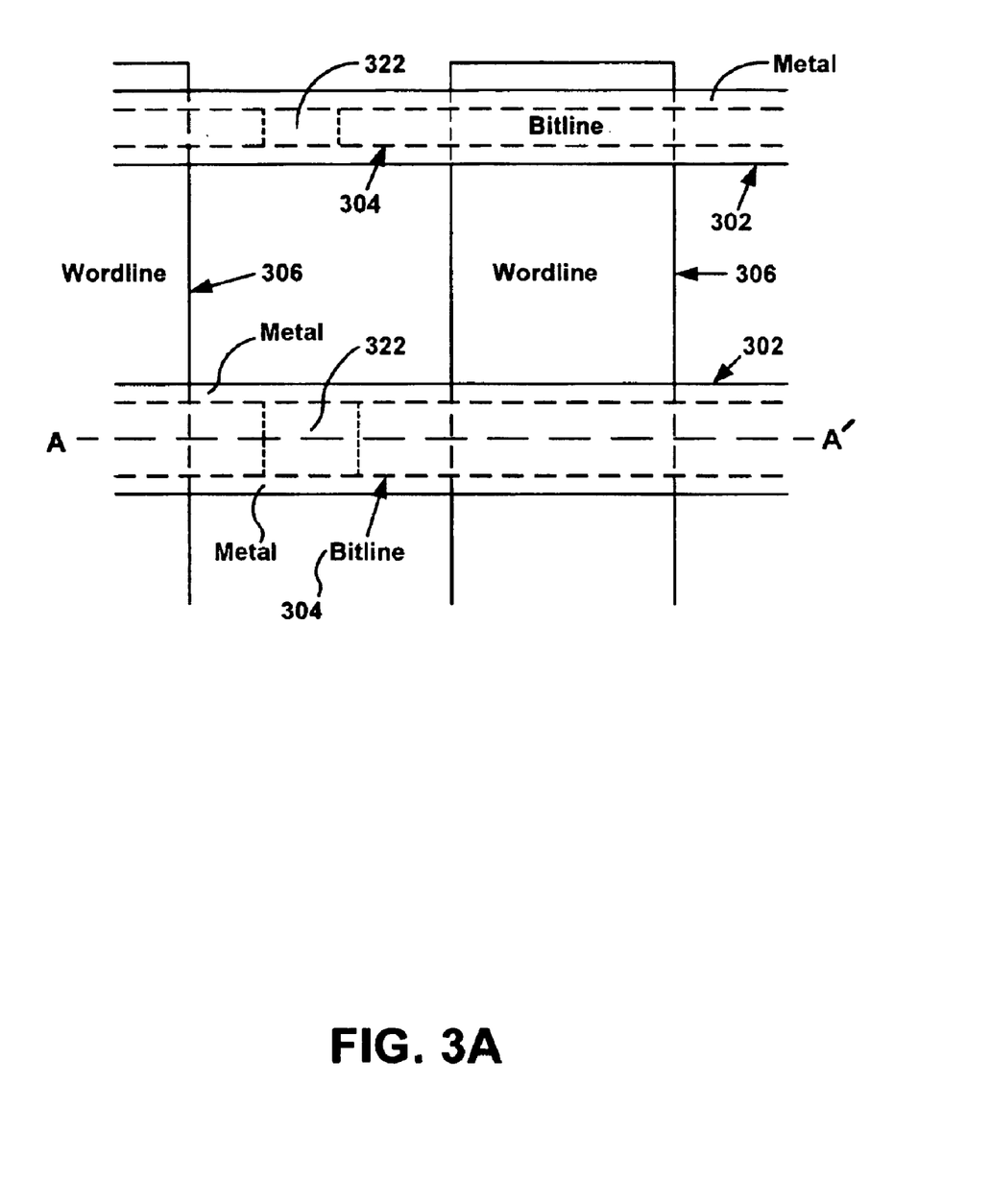
FIG. 3A is top view of a portion of a memory array that may be protected by embodiments of the present invention.
Figure 3B:
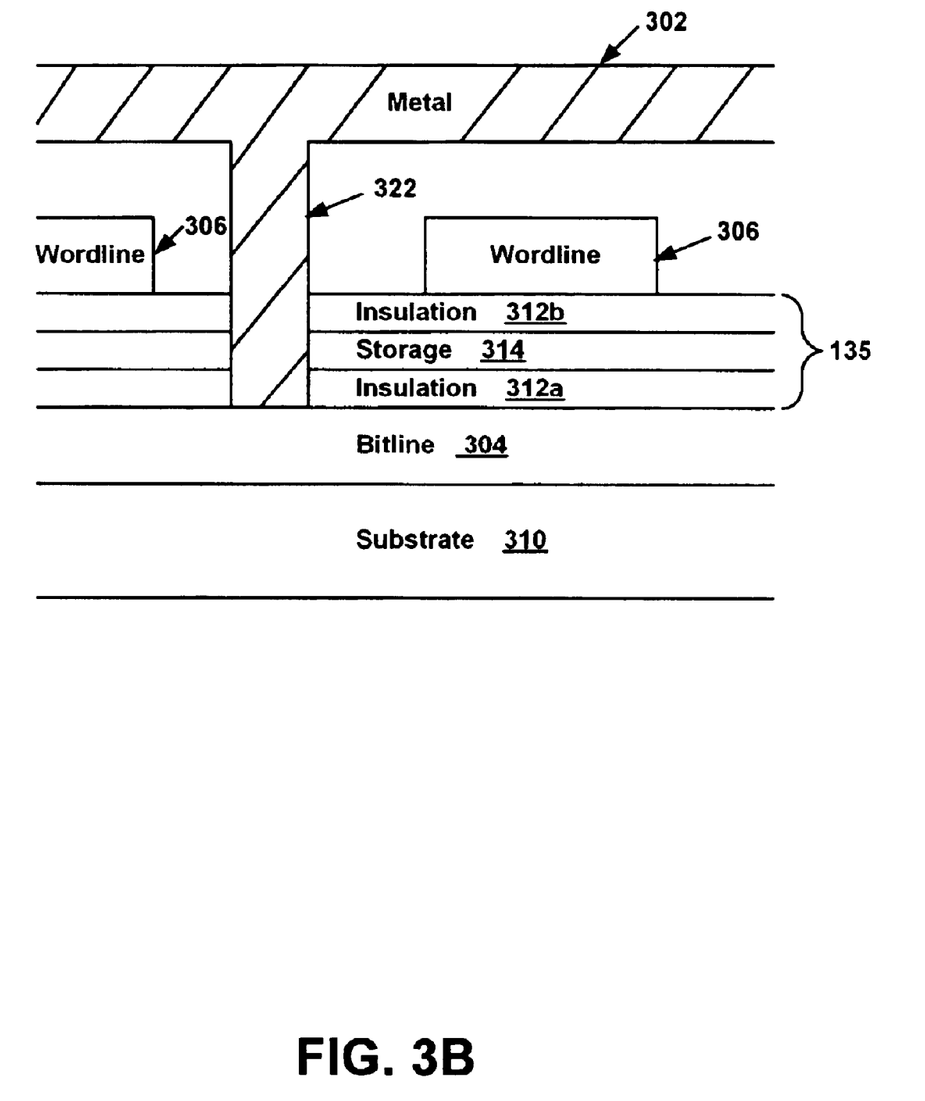
FIG. 3B is side sectional of a region of the memory array in FIG. 3A taken across the line AA', that may be protected by embodiments of the present invention.

An embodiment of the present invention alleviates, or at least reduces, a charge damage problem by reducing the antenna ratio between a metal line 302 and a bitline 304. FIG. 3A shows a top view of a portion of a memory cell array 200, while FIG. 3B illustrates a side sectional view of that structure along the line AA'. The top view shows two metal lines 302, each with a bitline 304 below. A metal contact 322 connects a metal line 302 with a bitline 304. Wordlines 306 also run below the metal lines 302.

Referring now to FIG. 3B, a bitline 304 resides above a substrate 310. The bitline 304 itself may be embedded in the substrate 310. Above the bitline 304 is an insulating layer 312a, which may be silicon dioxide, for example. Above that may be a charge storage layer 314, which may be silicon nitride, for example. Above that may be another insulating layer 312b, which may be silicon dioxide, for example.

Together the charge storage layer 314 and insulating layers 312a, 312b may form a data storage region 135. Wordlines 306 reside above the data storage region 135. The wordlines 306 may be formed from polysilicon. A metal region 302 may reside above the wordlines 306 and may have a portion thereof forming a metal contact 322 with one of the bitlines 304.

Embodiments of the present invention protect against charge damage that may occur due to a voltage differential that may form between a bitline 304 and a wordline 306 or between a wordline 306 and the substrate 310, during the fabrication process. The voltage difference may tend to form, at least in part, because of the metal line 302 coupled to a bitline 304. The charge damage may be the result of charge moving between the bitline 304 and the wordline 306 as a result of the voltage difference.

Embodiments of the present invention lower an antenna ratio to minimize the above-mentioned charge damage problem. The antenna ratio may be defined as a ratio between a metal line 302 and a bitline 304 to which it is electrically connected; or as a ratio between a metal line 302 and a wordline 306 to which it is electrically connected. For example, the ratio may be the ratio of the surface area of the two lines 302, 304.

In one embodiment, the antenna ratio is minimized during the fabrication process by keeping the size of the metal line 302 that is connected to a bitline 304 small during a substantial portion of the fabrication process. By the end of the fabrication process, the metal line 302 is connected to all necessary parts of the circuit, and hence the antenna ratio is higher. However, keeping the antenna ration low during portions of the fabrication process alleviates or reduces charge damage to the data storage region 135.

Figure 4:
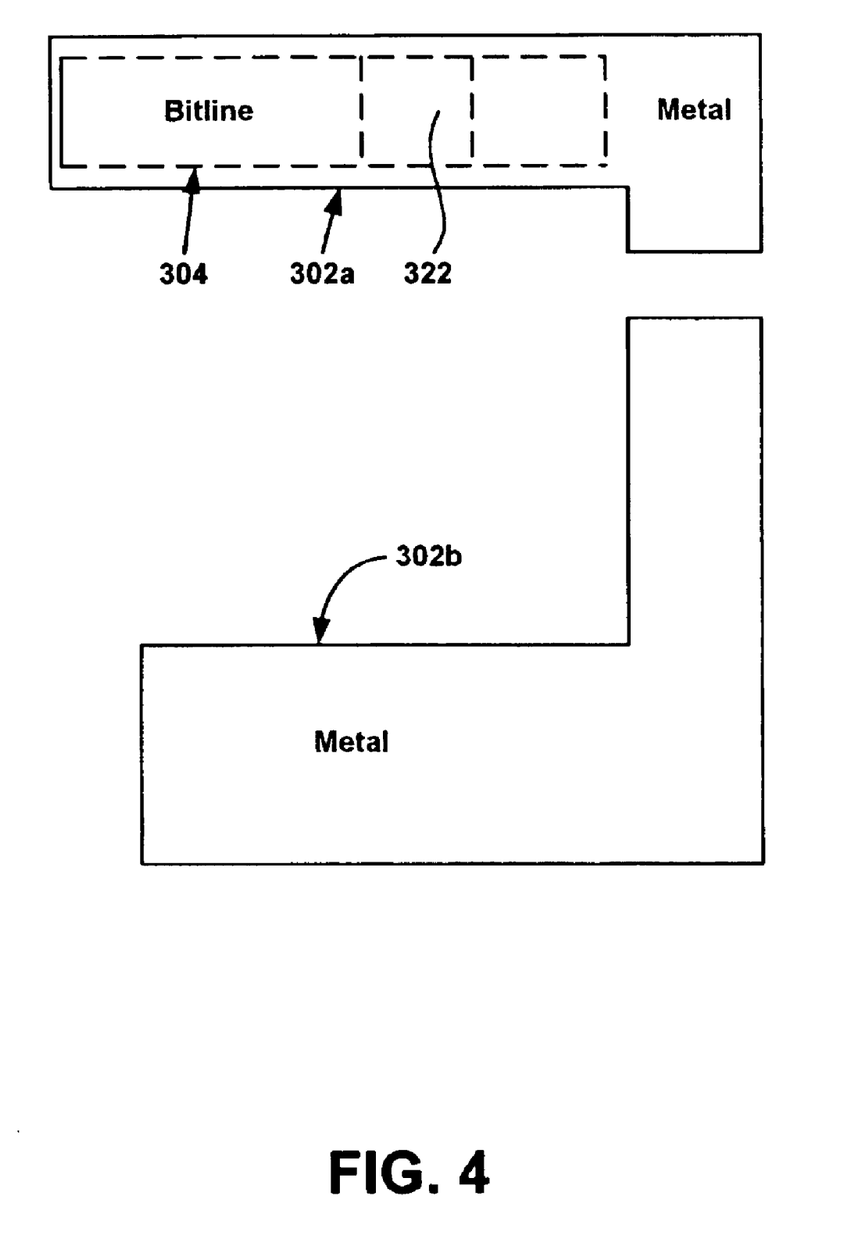
FIG. 4 is diagram illustrating a metal region separated into two metal regions to minimize an antenna ratio, according to an embodiment of the present invention.

FIG. 4 shows an embodiment in which a metal line 302 is formed initially as two separate regions. Referring now to FIG. 4, a first metal line 302a is shown above a bitline 304. The two are connected by a metal contact 322, as in FIGS. 3A and 3B. A second metal region 302b is also shown. At this stage of the fabrication process, the two metal regions 302a, 302b are not electrically coupled. However, by the end of the process they will be, as it may be necessary to form a contact between the first metal region 302a and other parts of the overall circuit.

Other embodiments of the present invention may be used to provide further protection from charge damage. In one embodiment of the present invention, a metal line 302 is coupled to a substrate 310 by a diode. In this fashion, rather than the metal line 302 providing a charge to the bitline 304 that may be exchanged between the bitline 304 and a wordline 306, the metal line 302 may exchange charge with the substrate 310. This embodiment may be used in addition to reducing the antenna ratio or independently.

Figure 5:
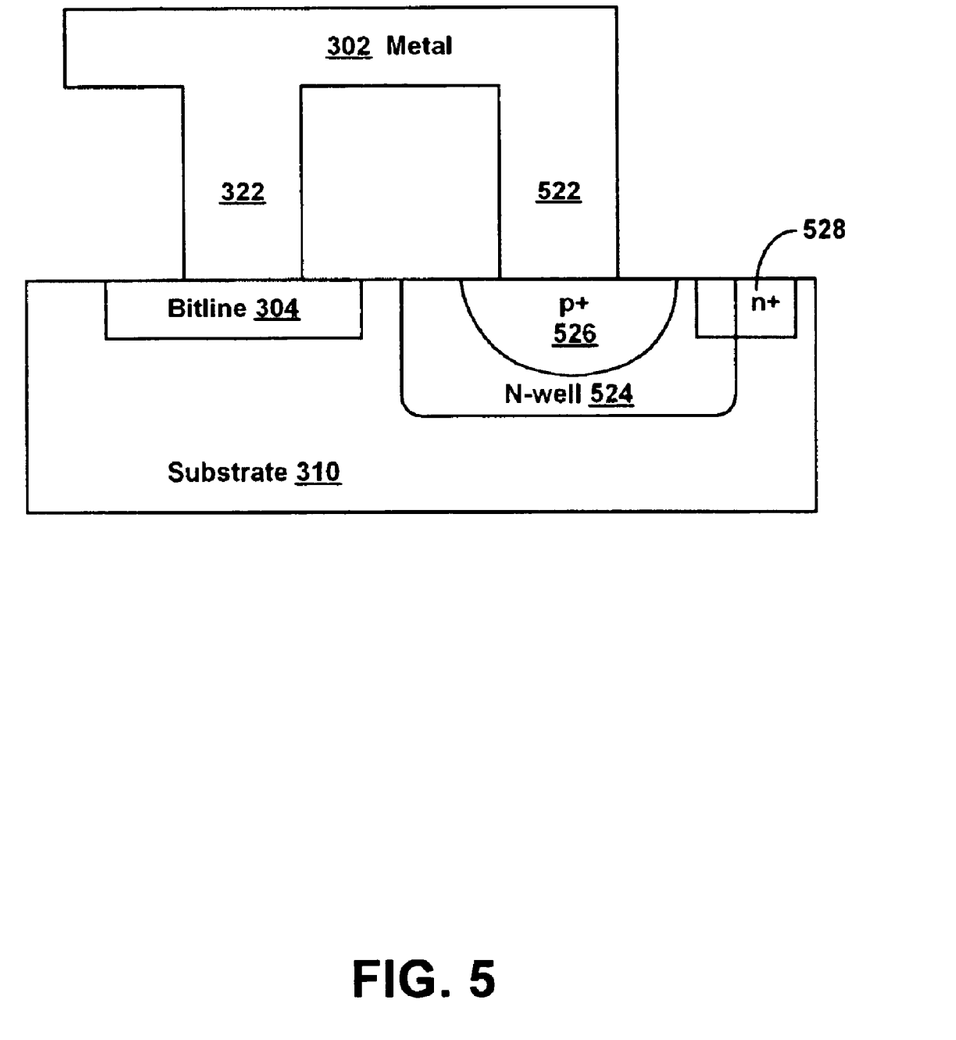
FIG. 5 is diagram illustrating a metal region coupled to a substrate via a diode, according to an embodiment of the present invention.

Referring now to the side sectional view in FIG. 5, a bitline 304 is shown embedded in the substrate 310. Note that this side sectional view is 90 degrees from the side sectional view of FIG. 3B. Thus, the bitline 304 is seen from its end. The metal line 302 not only has a metal contact 322 to the bitline 304, but it also has a metal contact 522 to a p+ region 526 of an N-well diode. The N-well diode, which is embedded in the substrate 310, is a two-way diode, thus having an n+ region 528 straddling the N-well region 524 of the diode and the substrate 310. Embodiments of the present invention are not limited to an N-well diode. For example, a P-well diode may be used, depending on the nature of the substrate 310 and other components.

In yet another embodiment of the present invention, a fuse is fabricated between a metal line 302 and the substrate 310 to alleviate or reduce the charge damage problem. The fuse is blown at some point in time before the memory array 200 is used. Referring now to the side sectional view in FIG. 6, a fuse 622 has been fabricated between the metal line 302 and the substrate 310. In this case, the fuse 622 connects to a p+ region 626 and the substrate 310 may be a p-substrate 310. However, embodiments of the present invention are not limited to a p-substrate 310 or the fuse connecting to a p+ region 626.

In yet another embodiment of the present invention, a fuse is fabricated between a bitline 304 and a wordline 306 to alleviate or reduce the charge damage problem. At some point in time before use as a memory device, the fuse may be blown. Referring now to the side sectional of FIG. 7, the bitline 304 is shown from the end and is embedded in the substrate 310. The wordline 306 is shown coupled to the bitline 304 through the fuse 822. The fuse 822 may be blown at any suitable time before use as a memory storage device.

An embodiment of the present invention is process for fabricating a memory array while protecting it from charge damage by reducing an antenna ratio between a metal region 302 and a bitline 304. Referring now to process 900 of FIG. 8, in step 910 bitlines 304 are formed above a substrate 310. The bitlines 304 may be embedded in a portion of the substrate 310. Portions of the bitlines may serve as source/drain regions of a memory cell 100. The memory cell 100 may be constructed such that the source and drain have very similar characteristics, for example, they mirror one another. However, this mirroring is not required.

In step 920, a region that is suitable for data storage 135 is formed above the bitlines 304. Referring to FIG. 3B, this region may comprise two silicon dioxide insulating layers 312a, 312b sandwiching a silicon nitride charge storage layer 314. However, embodiments of the present invention are not limited to these materials. Also, note that while embodiments of the present invention may be operable to store two charges in the charge storage layer 314, embodiments of the present invention are not so limited.

In step 930, wordlines 306 are formed above the data storage regions 135. The wordlines 306 may comprise gate regions 150. For example, in FIG. 2 two gate regions 150 are illustrated along the edge of the front wordline 306.

Figure 8:
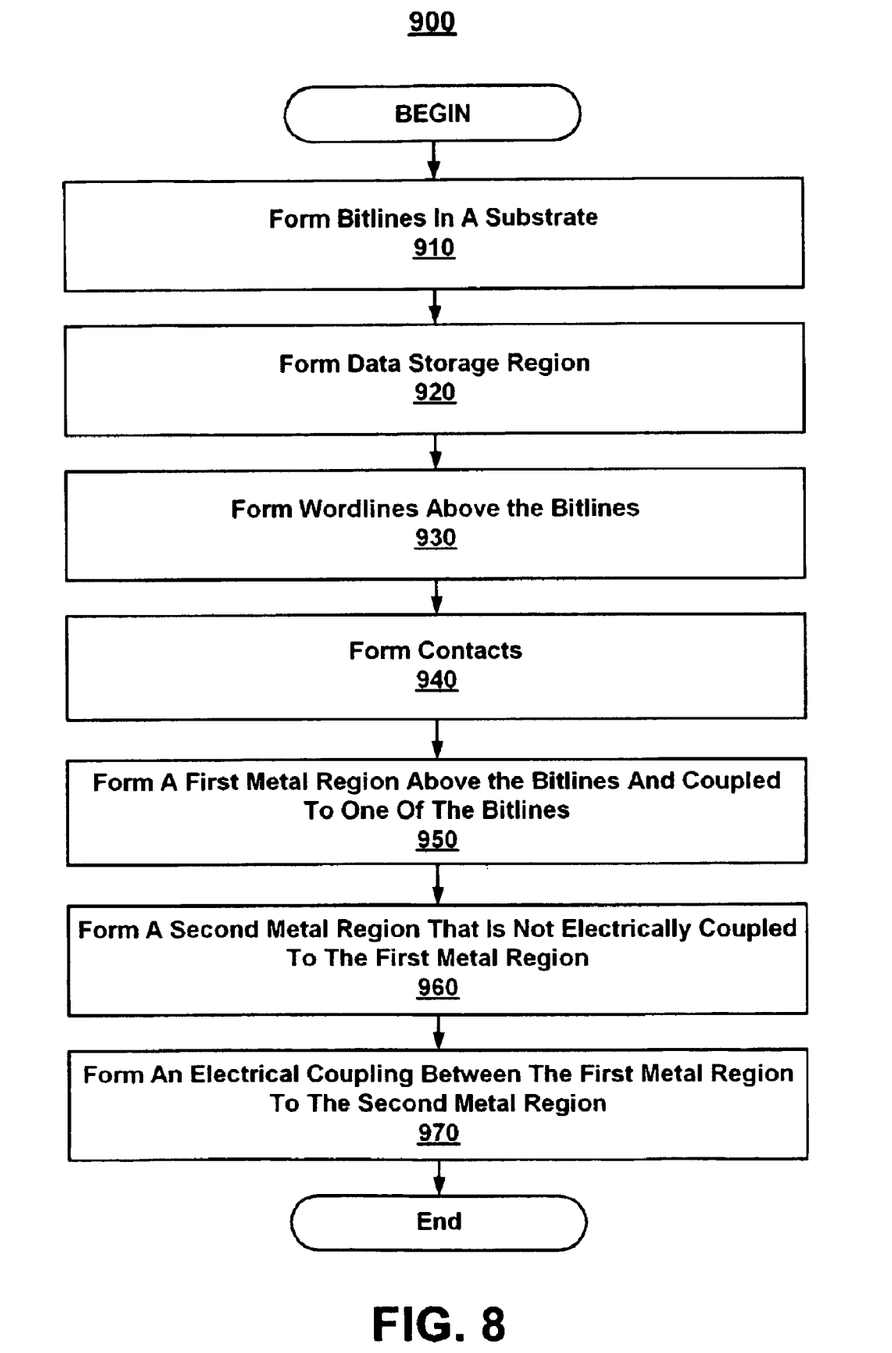
FIG. 8 is a flowchart illustrating steps of a process of fabricating a memory array while protecting storage areas from damage by reducing an antenna ratio, according to an embodiment of the present invention.

In step 940, contacts 322 are formed down to the bitlines 304. These contacts 322 will later be joined to metal lines 302 that may serve to apply a voltage to the bitlines 304, wherein the memory cells 100 may be written, read, and erased. The contacts 322 may be formed of any suitable material, such as aluminum, TiN, titanium, etc.

In step 950, a first metal region 302a is formed at some layer above the bitlines 304. For example, referring to FIG. 4, metal region 302a is formed above bitline 304. The overall fabrication may also include forming dielectric layers. Moreover, steps of applying masks, etching, etc. are not shown, but will be clear to one of ordinary skill in the art.

In step 960, a second metal region 302b is formed and is not electrically coupled to the first metal region 302a. In this fashion, the antenna ratio of the first metal region 302a to the bitline 304 is relatively low. This, in turn may keep the voltage difference between the bitline 304 and a nearby wordline 306 low. Keeping this voltage difference low may help to reduce charge damage to the data storage region 135, which may otherwise occur when charge is exchanges between a wordline 306 and a bitline 304. This damage may be more severe near a metal contact 322 between a metal region 302 and a bitline 304. The first 302a and second metal region 302b may be in the same layer and hence may be formed at essentially the same time.

In step 970, the first and second metal regions 302a, 302b are coupled together. This step 970 may be taken at any convenient time before the device is used as a memory device, but may likely be done during at a relatively later time in the overall fabrication of the memory array 200. In this fashion, the protection is provided during as much of the fabrication process as possible. Process 900 then ends.

However, it may not be possible to delay the joining of the first and second metal regions 302a, 302b until the memory array 200 is completely fabricated. Hence, some additional protective measures may be taken. The following measures may be exercised independently or in any desired combination, with or without the steps of process 900.

Figure 6:
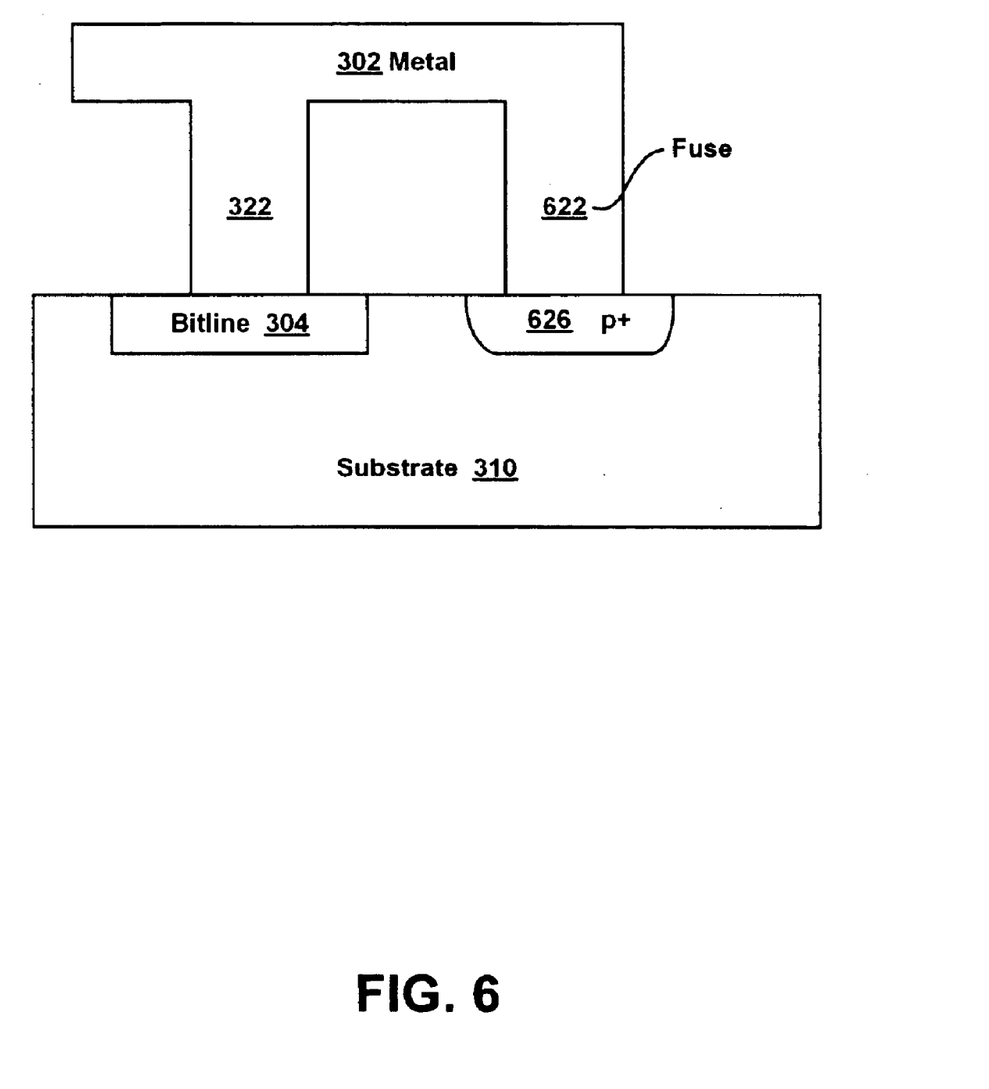
FIG. 6 is diagram illustrating a metal region coupled to a substrate via a fuse, according to an embodiment of the present invention.
Figure 9:
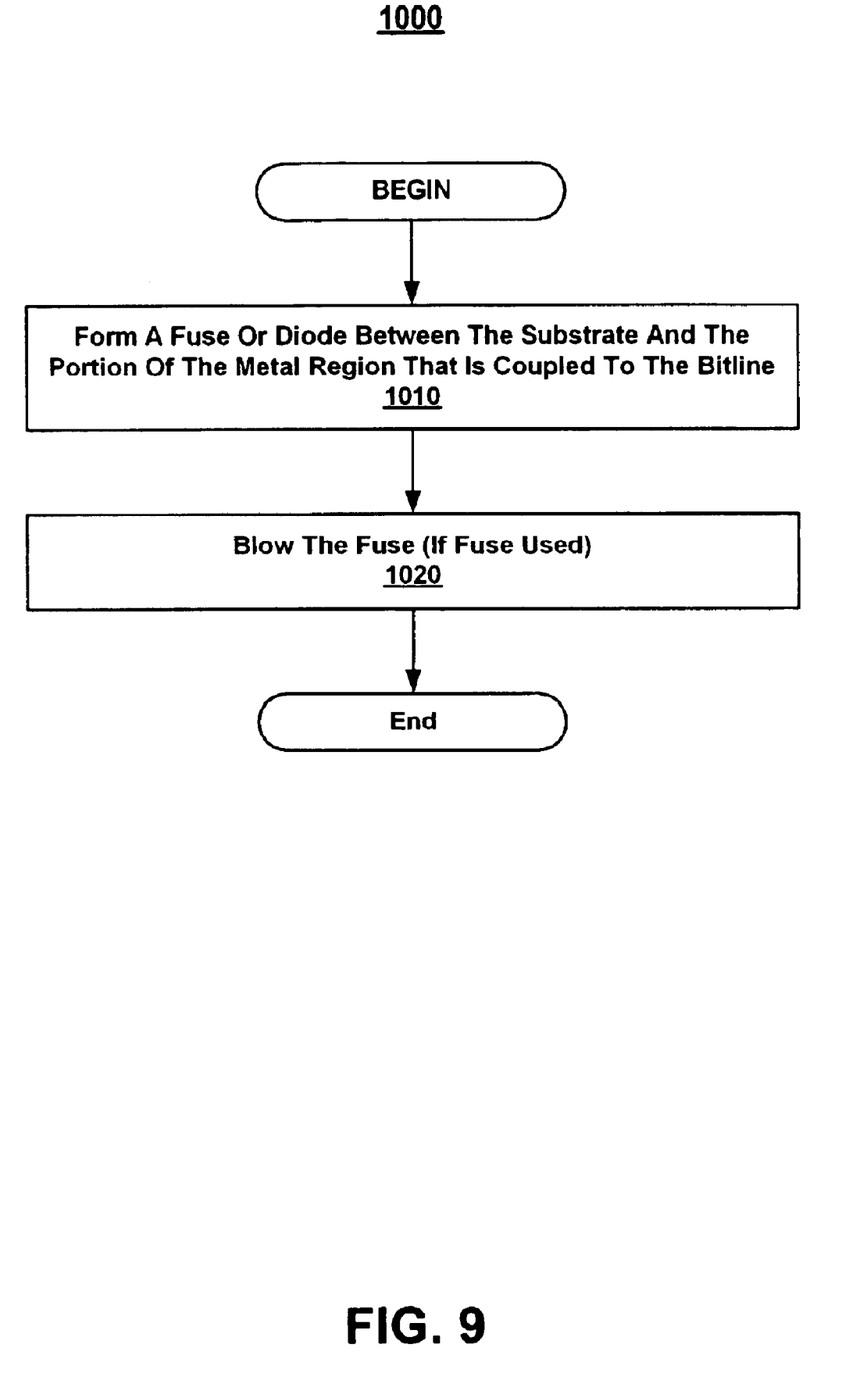
FIG. 9 is a flowchart illustrating steps of a process of fabricating a memory array while protecting storage areas from damage, according to an embodiment of the present invention.

Referring now to process 1000 of FIG. 9, an embodiment of the present invention provides for a method of protecting a memory array 200 against charge damage during fabrication by forming a diode or a fuse 622 between a metal line 302 and a substrate 310. In step 1010, a fuse 622 or a diode is formed between the substrate 310 and a portion of the metal line 302 that is coupled to the bitline 302. For example, FIG. 5 illustrates a diode and FIG. 6 illustrates a fuse 622 so positioned.

In step 1020, the fuse 622 is blown, in the embodiment featuring a fuse 622. This step may be taken at any convenient time before the memory array is used. Thus, when this embodiment is combined with process 900, it may be that the fuse 622 is in place after the two metal regions 302a, 302b have been joined. In the embodiment in which a diode is used, the diode may be left in place during use as a memory array 200. Process 1000 then ends.

Figure 7:
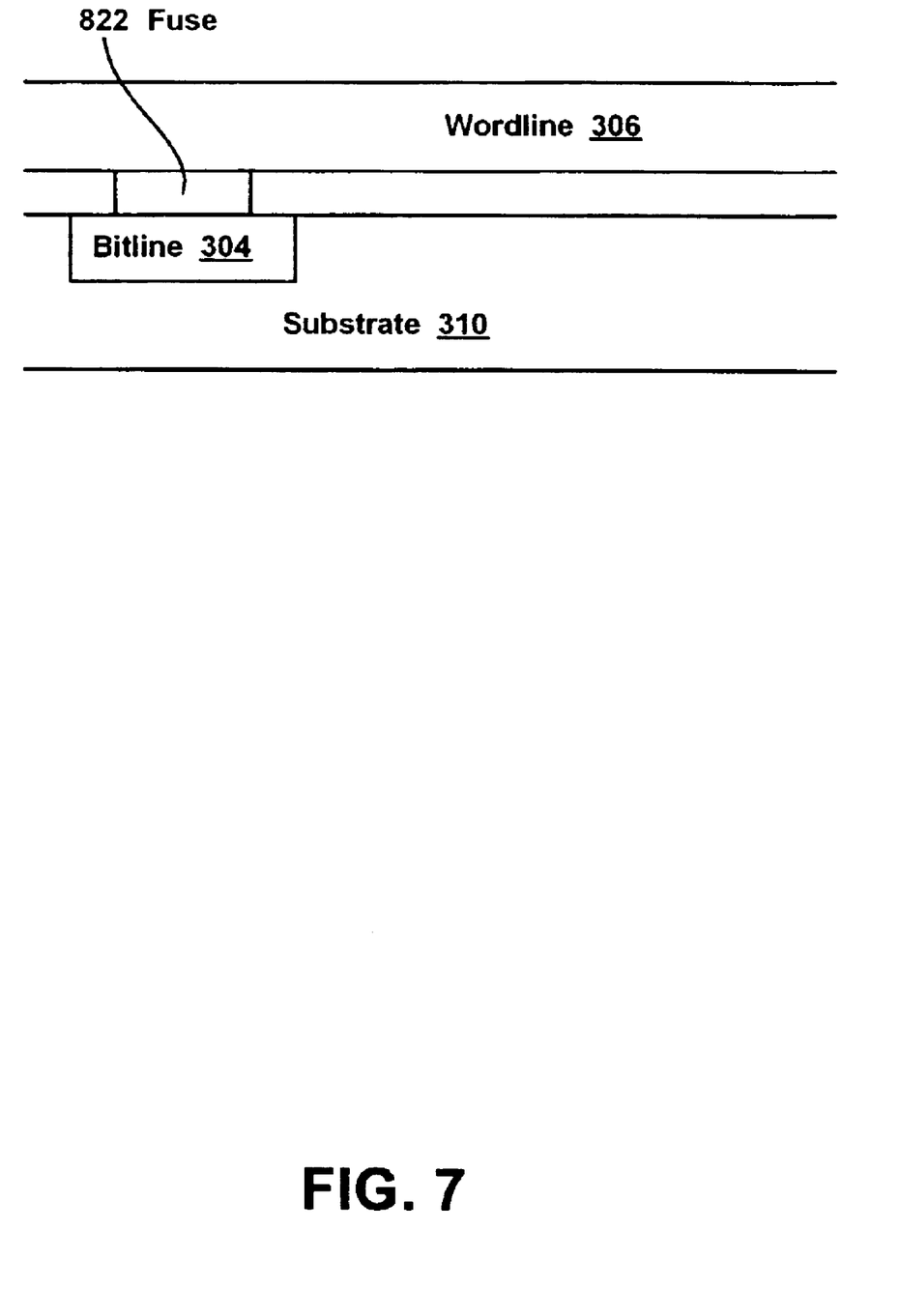
FIG. 7 is diagram illustrating a bitline coupled to a wordline via a fuse, according to an embodiment of the present invention.
Figure 10:
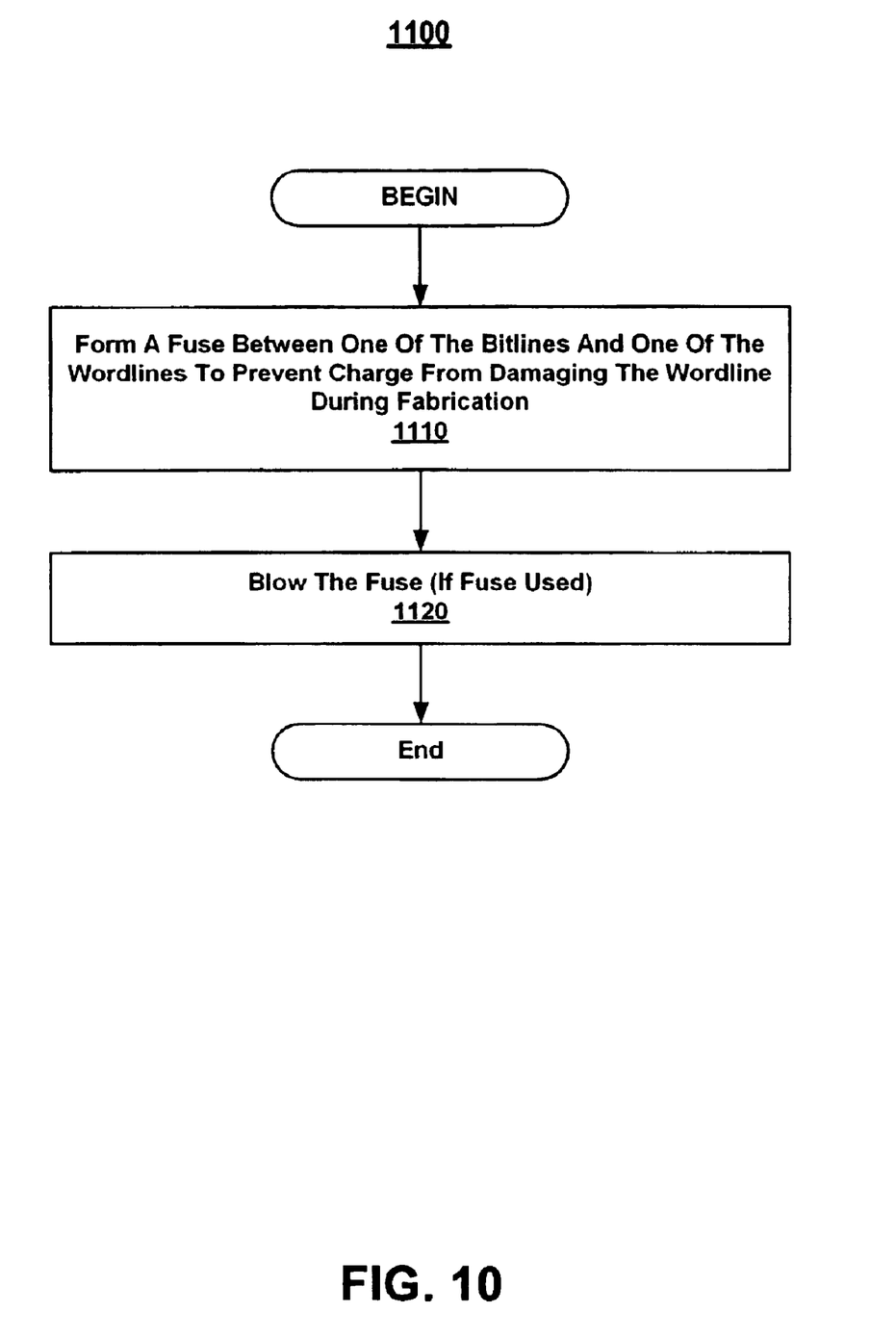
FIG. 10 is a flowchart illustrating steps of a process of fabricating a memory array while protecting storage areas from damage, according to an embodiment of the present invention.

Referring now to process 1100 of FIG. 10, an embodiment of the present invention provides for a method of protecting a memory array against charge damage during fabrication by forming a fuse 822 between a wordline 306 and a bitline 304. In step 1110, a fuse 822 is formed between the wordline 306 and the bitline 304. For example, FIG. 7 illustrates a fuse 822 so positioned.

In step 1120, the fuse 822 is blown, in the embodiment featuring a fuse 822. This step may be taken at any convenient time before the memory array 200 is used. Thus, when this embodiment is combined with process 900, it may be that the fuse 822 is in place after the two metal regions 302a, 302b have been joined. Process 1100 then ends. It will be understood that steps of process 1100 may be used with steps of process 1000.

Therefore, it will be seen that embodiments of the present invention prevent charge damage to data storage areas during fabrication of a memory array. Embodiments of the present invention protect a memory array having buried bitlines.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of fabricating a memory array, comprising:
 a) partially forming said memory array during a first formation stage comprising:

i) forming a plurality of bitlines in a substrate, wherein said bitlines comprise source/drain regions of memory cells;

ii) forming a plurality of data storage regions above said bitlines;

iii) forming a plurality of wordlines above said data storage regions, wherein said wordlines comprise gate regions of said memory cells;

iv) forming a first metal region above a first of said bitlines and coupled to said first bitline; and v) forming a second metal region that is not electrically coupled to said first metal region, wherein an antenna ratio between said first of said bitlines and said first metal region is lower than if said first and second metal regions were electrically coupled; and b) forming an electrical coupling between said first metal region to said second metal region after said first formation stage, wherein said second metal region does not contribute to charge damage to said data storage regions during said first formation stage.

2. The method of claim 1, wherein said partially forming said memory array further comprises:

forming a diode between said substrate and said portion of said metal region that is coupled to said first bitline.

3. The method of claim 2, wherein said partially forming said memory array further comprises:

forming a fuse between said first bitline and one of said wordlines to prevent charge from damaging ones of said plurality of data storage regions during fabrication; and blowing said fuse.

4. The method of claim 1, wherein said partially forming said memory array further comprises:

fabricating a fuse between said substrate and said portion of said metal layer that is electrically coupled to said first bitline to prevent damage to a data storage region of said plurality of data storage regions that is under a wordline of said plurality of wordlines near said coupling of said first metal region to said first bitline; and blowing said fuse.

5. The method of claim 4, wherein said partially forming said memory array further comprises:

fabricating a fuse between said first bitline and a first of said wordlines to prevent charge from damaging a first of said plurality of data storage regions and which is under said first wordline during fabrication; and blowing said fuse.

6. The method of claim 1, wherein said partially forming said memory array further comprises:

fabricating a fuse between said first bitline and one of said wordlines to prevent charge from damaging a first of said plurality of data storage regions associated with said one wordline during fabrication; and blowing said fuse.

7. The method of claim 1, wherein said partially forming said memory array further comprises:

fabricating a diode between said first bitline and one of said wordlines to prevent charge from damaging a first of said plurality of data storage regions during fabrication.

8. A method of protecting a memory array during fabrication, said method comprising the steps of:

forming a first and a second region in a substrate, said first and a second regions operable to function as sources or drains;

forming a third region operable to store a charge above said first and a second regions;

forming a fourth region above said third region, said fourth region operable to function as gates, wherein portions of said first, second, third, and fourth regions form a memory cell operable to store charge in two locations in said third region;

forming a metal region above said fourth region and coupled to one of said first and second regions;

forming a fuse between said metal region and said substrate to prevent excessive charge from damaging said third region during fabrication; and blowing said fuse.

9. The method of claim 8 further comprising the step of:

forming an electrical coupling between a second metal region and said metal region coupled to said one of said first and second regions.

10. The method of claim 8 further comprising the step of:

forming a second fuse between said first region and said second region; and blowing said second fuse.

11. A method of protecting a memory array during fabrication, said method comprising the steps of:

forming a first plurality of regions in a substrate, said regions operable to function as sources or drains;

forming a second plurality of regions above first plurality, said second plurality operable to function as data storage regions;

forming a third plurality of regions above second plurality, said third plurality operable to function as gates;

forming a metal region above said third plurality of regions and coupled to one of said first plurality of regions;

forming a diode between said metal region and said substrate to prevent excessive charge from damaging one of said data storage regions during fabrication.

12. The method of claim 11 further comprising the steps of:

forming a second metal region; and forming an electrical coupling between said second metal region and said metal region above said third plurality of regions.

13. The method of claim 11, further comprising the step of:

forming a diode between one of said first plurality of regions and one of said third plurality of regions.

14. A method of protecting a memory array during fabrication, said method comprising the steps of:

forming a pair of source/drain regions in a substrate;

forming a storage region above said source/drain regions and comprising a nitride region between two insulating regions, wherein said storage region is operable to store charge in two locations;

forming a gate region above said storage region;

forming a metal region coupled to one region of said pair of source/drain regions;

forming a fuse between said gate region and said one of said pair of source/drain regions to prevent charge from damaging said storage region during fabrication; and blowing said fuse.

15. The method of claim 14 further comprising the step of:

completing said metal region by forming a remaining portion of said metal region and coupling said remaining portion of said metal region to said metal region coupled to said one region of said pair of source/drain regions.

16. The method of claim 14 further comprising the step of:

forming a second fuse between said metal region and said substrate; and blowing said second fuse.

17. A method of protecting a memory array during fabrication, said method comprising the steps of:

forming a plurality of bitlines in a substrate, each bitline comprising source/drain regions;

forming a data storage region comprising a nitride region between two insulating regions, wherein said data storage region is operable to store charge in two locations;

forming a plurality of wordlines above said data storage region and comprising gate regions;

forming a metal region coupled to a first of said plurality of bitlines;

forming a diode between said first bitline and a first of said plurality of wordlines to prevent charge from damaging said data storage region during fabrication.

18. The method of claim 17 further comprising the step of:

completing said metal region by forming a remaining portion of said metal region and coupling said remaining portion of said metal region to said metal region coupled to said first bitline.

19. The method of claim 17 further comprising the step of:

forming a diode between said metal region and said substrate.

* * * * *